(12) United States Patent
Song et al.

(10) Patent No.: US 10,541,616 B2
(45) Date of Patent: Jan. 21, 2020

(54) POWER ADAPTOR

(71) Applicant: Delta Electronics (Shanghai) Co., Ltd., Shanghai (CN)

(72) Inventors: Hai-Bin Song, Shanghai (CN); Jin-Fa Zhang, Shanghai (CN); Dao-Fei Xu, Shanghai (CN); Jian Zhou, Shanghai (CN); Qi Fu, Shanghai (CN); Xiao-Jun Chen, Shanghai (CN); Jian-Wei Song, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 314 days.

(21) Appl. No.: 15/462,907

(22) Filed: Mar. 19, 2017

(65) Prior Publication Data

US 2017/0331378 A1    Nov. 16, 2017

(30) Foreign Application Priority Data

May 13, 2016    (CN) ...................... 2016 2 0440616 U (51) Int. Cl.
| | |
|---|---|
| H05K 7/00 | (2006.01) |
| H02M 3/24 | (2006.01) |
| H02J 7/00 | (2006.01) |
| H02M 1/12 | (2006.01) |
| H03H 7/01 | (2006.01) |
| H05K 7/14 | (2006.01) |
| H05K 1/02 | (2006.01) |

(52) U.S. Cl.
CPC ............... *H02M 3/24* (2013.01); *H02J 7/00* (2013.01); *H02M 1/126* (2013.01); *H03H 7/0115* (2013.01); *H05K 7/1427* (2013.01); *H05K 1/028* (2013.01)

(58) Field of Classification Search
USPC .......................................................... 361/728
See application file for complete search history.

(56) References Cited

U.S. PATENT DOCUMENTS

| | | | | |
|---|---|---|---|---|
| 8,400,772 | B2* | 3/2013 | Hortig ..................... | H05K 1/141 361/729 |
| 8,446,733 | B2* | 5/2013 | Hampo .................. | H05K 1/144 361/775 |
| 8,971,038 | B2* | 3/2015 | Sharaf .................... | H05K 7/209 165/104.33 |
| 2008/0058028 | A1* | 3/2008 | Nakayama ............ | H02J 7/0042 455/573 |
| 2012/0269677 | A1* | 10/2012 | Zhou ........................ | A61L 9/22 422/4 |
| 2018/0049314 | A1* | 2/2018 | Amaducci ................ | H03H 1/00 |

FOREIGN PATENT DOCUMENTS

| | | |
|---|---|---|
| CN | 101136580 A | 3/2008 |
| CN | 203617879 U | 5/2014 |

* cited by examiner

*Primary Examiner* — Hung S. Bui
(74) *Attorney, Agent, or Firm* — CKC & Partners Co., LLC (57) ABSTRACT

A power adaptor includes a main electric unit, a transformer unit and a bus capacitor unit. The main electric unit is disposed on a first surface. The transformer unit is configured on the main electric unit and disposed on a second surface. The first surface is perpendicular to the second surface. The main electric unit and the transformer unit form a containing space. The bus capacitor unit includes at least one bus capacitor. The bus capacitor unit is disposed in the containing space.

23 Claims, 11 Drawing Sheets

POWER ADAPTOR

RELATED APPLICATIONS

This application claims priority to China Application Serial Number 201620440616.5, filed May 13, 2016, which is herein incorporated by reference.

BACKGROUND

Field of Invention

The present invention relates to a power conversion device. More particularly, the present invention relates to a power adaptor.

Description of Related Art

A traditional power adaptor is formed by using a printed circuit board, and then disposing discrete plug-in elements on and assembling them with the printed circuit board. Since heights and shapes of the various plug-in elements differ, space is thus wasted in assembly, which in turn limits the miniaturization of the power adaptor. In addition, much manual work is required to assemble the power adaptor, which is disadvantageous for automated production. In addition to that, a transformer is usually located at a center of the power adaptor. Not only is the heat dissipation hindered, but the traditional wire-wound transformer also needs manual work to complete its assembly. It is therefore disadvantageous for automated production.

For the foregoing reasons, there is a need to solve the above-mentioned problems by providing a power adaptor.

SUMMARY

The summary aims to provide a brief description of the disclosure so that readers can understand the disclosure fundamentally. The summary does not describe the disclosure completely, and does not intend to specify the important/critical elements of the embodiments of the present disclosure or limit the scope of the present disclosure.

A power adaptor is provided. The power adaptor comprises a main electric unit, a transformer unit, and a bus capacitor unit. The main electric unit is disposed on a first surface. The transformer unit is configured on the main electric unit and disposed on a second surface. The first surface is perpendicular to the second surface. The main electric unit and the transformer unit form a containing space. The bus capacitor unit comprises at least one bus capacitor. The bus capacitor unit is disposed in the containing space.

The disclosure provides a power adaptor. The power adaptor comprises a main electric unit, a transformer unit, and a bus capacitor unit. The transformer unit is configured on an outer side of the power adaptor. The main electric unit and the transformer unit form a containing space. The bus capacitor unit comprises at least one bus capacitor. The bus capacitor unit is disposed in the containing space.

Therefore, the present disclosure provides a power adaptor to improve the problem that the miniaturization design of the power adaptor is disadvantageous for heat dissipation, and also improve the problem that space is wasted when assembling the discrete plug-in elements of the traditional power adaptor to avoid limiting the miniaturization of the power adaptor. In addition, the problem that much manual work is required when using the discrete plug-in elements to assemble the power adaptor, which is disadvantageous for automated production, is also improved. Additionally, the present disclosure further improves the problem that the traditional wire-wound transformer needs manual work to complete its assembly, which is also disadvantageous for automated production.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

According to the usual mode of operation, various features and elements in the figures have not been drawn to scale, which are drawn to the best way to present specific features and elements related to the disclosure. In addition, among the different figures, the same or similar elements symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

As used herein, "couple" refers to direct physical contact or electrical contact or indirect physical contact or electrical contact between two or more devices. Or it can also refer to reciprocal operations or actions between two or more devices.

A power adaptor usually comprises an isolation converter. The isolation converter comprises a transformer, a primary-side circuit, a secondary-side circuit, and a control circuit. The primary-side circuit usually comprises a main power switch, a main power switch driving circuit, and a main controller. The secondary-side circuit comprises a rectifying switch, a secondary-side controller, and an output capacitor.

Figure 1A:
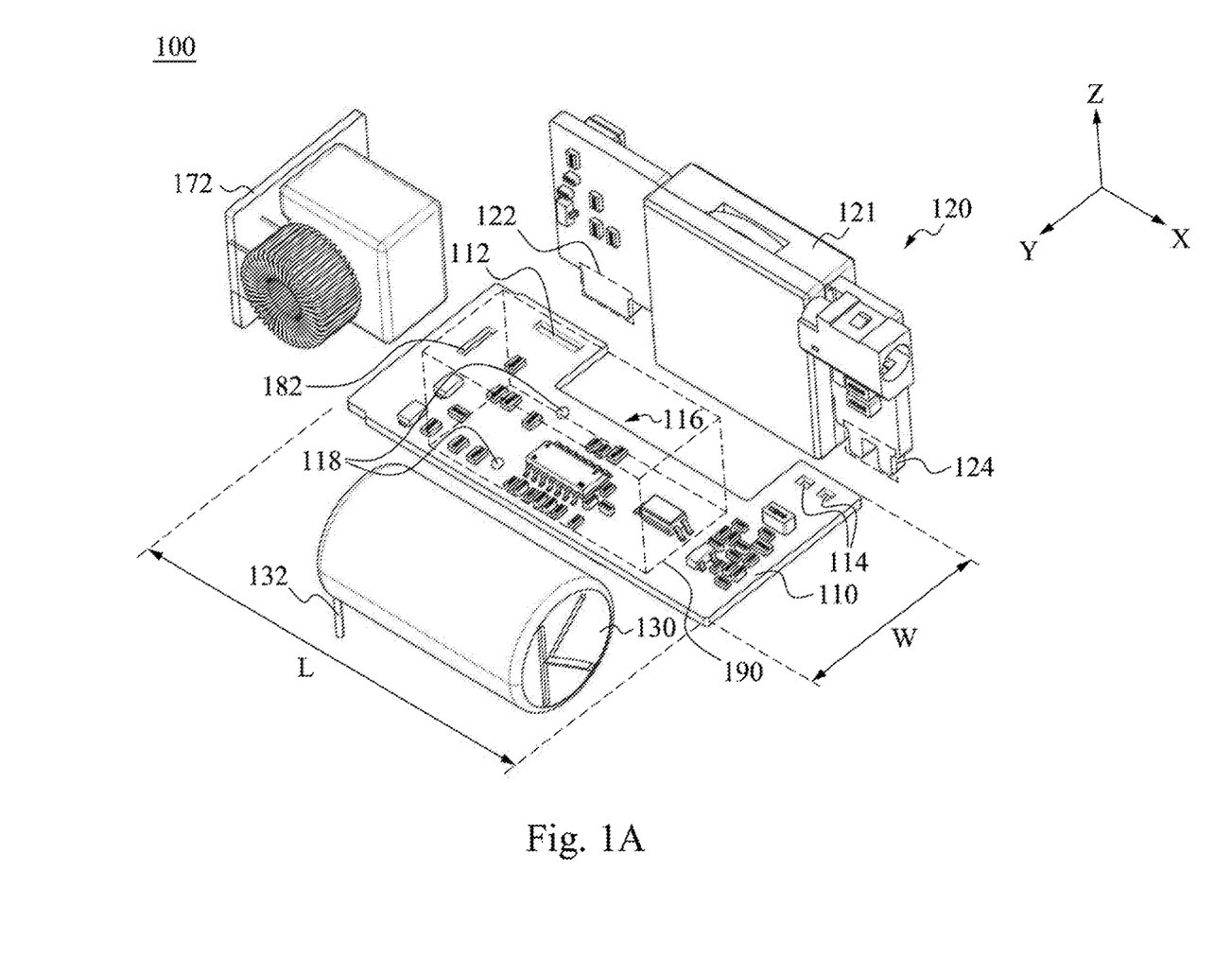
FIG. 1A depicts an assembly schematic diagram of a power adaptor according to embodiments of this disclosure.

FIG. 1A depicts an assembly schematic diagram of a power adaptor according to embodiments of this disclosure. As shown in FIG. 1, a power adaptor 100 comprises a main electric unit 110, a transformer unit 120, and a bus capacitor unit 130. The transformer unit 120 comprises a transformer 121. The main electric unit 110 is disposed on a first surface (for example: disposed on the X-Y plane). The transformer unit 120 is configured on the main electric unit 110 and disposed on a second surface (for example: disposed on the X-Z plane). The first surface (such as the X-Y plane) is perpendicular to the second surface (such as the X-Z plane), and a containing space 190 is formed between the main electric unit 110 and the transformer unit 120. The bus capacitor unit 130 may be disposed in the containing space 190.

Figure 1B:
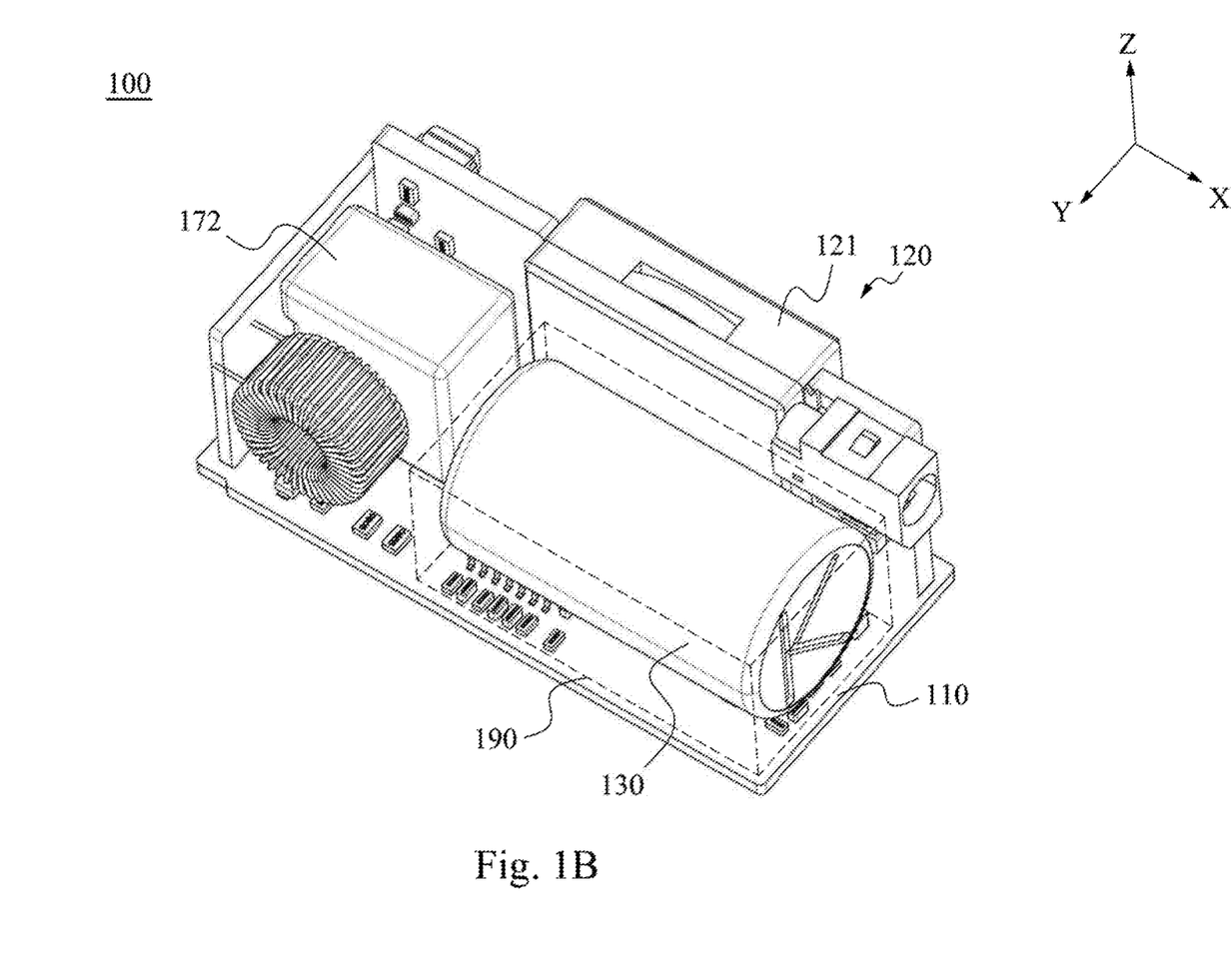
FIG. 1B depicts a schematic diagram of a power adaptor according to embodiments of this disclosure.

A description is provided with reference to FIG. 1A. In one embodiment, the main electric unit 110 comprises at least one fixing slot, such as fixing slots 112, 114. Correspondingly, the transformer unit 120 comprises at least one fixing portion, such as fixing portions 122, 124. The above fixing portions are configured to be joined to the fixing slots correspondingly. For example, the fixing portion 122 is joined to the corresponding fixing slot 112, and the fixing portion 124 is joined to the corresponding fixing slots 114 so as to fix the transformer unit 120 on the main electric unit 110. In one embodiment, the transformer unit 120 and the main electric unit 110 are electrically connected through the fixing portions 122, 124 and the fixing slots 112, 124. In still another embodiment, the main electric unit 110 comprises at least one fixing hole 118, and the bus capacitor unit 130 comprises at least one fixing pillar 132. The fixing pillar 132 is configured to be joined to the fixing hole 118 correspondingly so that the bus capacitor unit 130 is fixed on the main electric unit 110. In one embodiment, the bus capacitor unit 130 and the main electric unit 110 are electrically connected through the fixing pillar 132 and the fixing hole 118. The power adaptor 100 thus assembled is provided with reference to FIG. 1B. As shown in FIG. 1B, the power adaptor 100 according to the present disclosure forms a three-dimensional structure, such as a structure in a rectangular parallelepiped according to the present embodiment. In addition, as can be seen from FIG. 1B, space inside the three-dimensional structure is fully utilized so that a volume of the power adaptor 100 can be reduced to fulfill the miniaturization requirement.

Additionally, the transformer 121 is the main heat-generating element of the power adaptor 100. As shown in FIG. 1B, the transformer unit 120 is configured on the outer side of the whole power adaptor 100 according to the present disclosure. Therefore, it is very advantageous for the transformer unit 120 to directly dissipate heat to the outside. Configuring the transformer unit 120 on the outer side of the power adaptor 100 means that the transformer unit 120 is located at an outermost area of an inside of the power adaptor 100 (or called an outermost area) to facilitate the transformer unit 120 to dissipate heat to the outside. In addition, owing to the characteristic that the bus capacitor unit 130 does not easy generating heat, the bus capacitor unit 130 is disposed at a position immediately adjacent to the transformer unit 120 according to the present disclosure, such that the bus capacitor unit 130 is utilized to further conduct heat of the transformer unit 120 to an encapsulating housing (not shown in the figure). As a result, a miniaturization design of the power adaptor 100 can be realized according to the present disclosure and the heat dissipation problem can be solved.

In addition to that, the present disclosure power adaptor 100 adopts a unit configuration method. A bus capacitor is disposed as a unit (such as the bus capacitor unit 130), the transformer 121 and relevant elements are disposed as a unit (such as the transformer unit 120), and the other elements are disposed as a unit (such as the main electric unit 110). In this manner, the power adaptor 100 shown in FIG. 1B is thus formed by assembling each of the units after adopting the unit configuration. The manual work is significantly reduced, which is very advantageous for automated production.

As shown in FIG. 1A, the transformer in the transformer unit 120 according to the present disclosure adopts a flat transformer. Its coil is assembled in a printed circuit board. The printed circuit board is usually a multilayer board and more copper is poured in the printed circuit board, which is further beneficial for the heat dissipation of the transformer unit 120. Additionally, the coil may be formed by some other method depending on practical needs, such as using a wire cake. Hence, a surface area of the transformer is increased to facilitate heat dissipation because the flat transformer is adopted in the present disclosure. In addition, secondary-side circuit elements may be disposed depending on practical requirements. For example, all or part of the secondary-side circuit elements, such as the rectifying switch, the secondary-side controller, and the output capacitor, etc. are disposed in the transformer unit 120. As a result, the rectifying loop of the secondary-side circuit is reduced, which is advantageous for improving the overall efficiency. The main electric unit 110 is mainly disposed with the control circuit, however, all or part of the elements on the primary side, such as the main power switch, the main power switch driving circuit, and the main controller, etc. may be disposed in the main electric unit 110, but the present disclosure is not limited in this regard. All or part of the elements on the primary side, such as the main power switch, the main power switch driving circuit, and the main controller, etc. may be disposed in the transformer unit 120. In addition to that, the printed circuit board of the main electric unit 110 is usually a double layer board to satisfy the electrical requirements. It is noted that, in one embodiment, the elements in the transformer unit 120 and the main electric unit 110 are assembled by automated production and then are soldered according to the present disclosure. Basically, less manual work is required, which extremely facilitates automated production. Additionally, shapes and numbers of layers of the transformer unit 120 and the main electric unit 110 are not limited, the above description only serves as an example for illustration.

In one embodiment, the power adaptor 100 further comprises an electromagnetic interference filter unit 172. The electromagnetic interference filter unit 172 comprises a filter inductor and a filter capacitor. In one embodiment, the electromagnetic interference filter unit 172 is disposed on the main electric unit 110. For example, the electromagnetic interference filter unit 172 can be fixed on the main electric unit 110 through a fixing slot 182. In one embodiment, the electromagnetic interference filter unit 172 may be disposed on the transformer unit 120. In one embodiment, the filter inductor and the filter capacitor of the electromagnetic interference filter unit 172 can be integrated into the main electric unit 110 or the transformer unit 120.

Figure 2A:
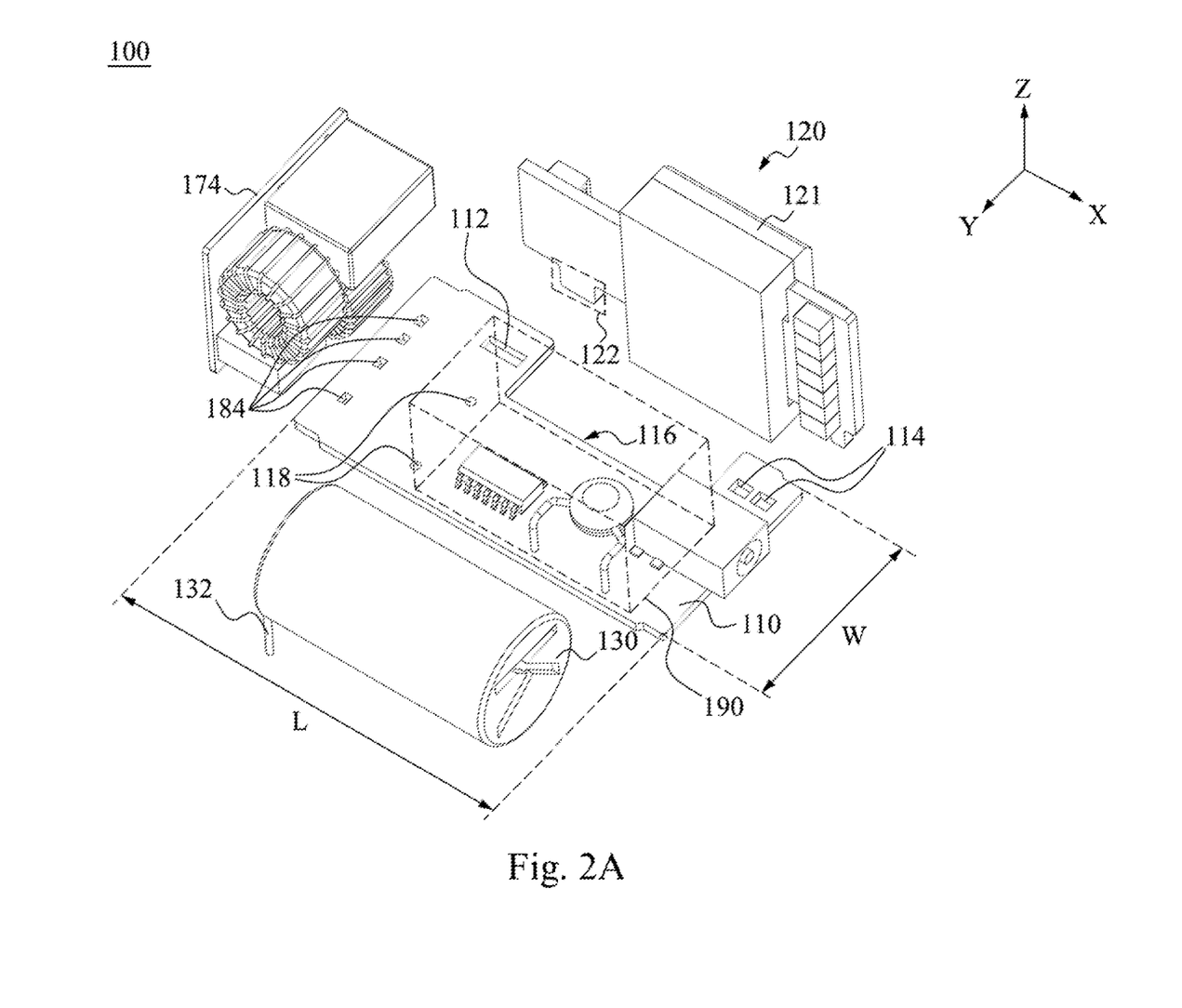
FIG. 2A depicts an assembly schematic diagram of a power adaptor according to embodiments of this disclosure.
Figure 2B:
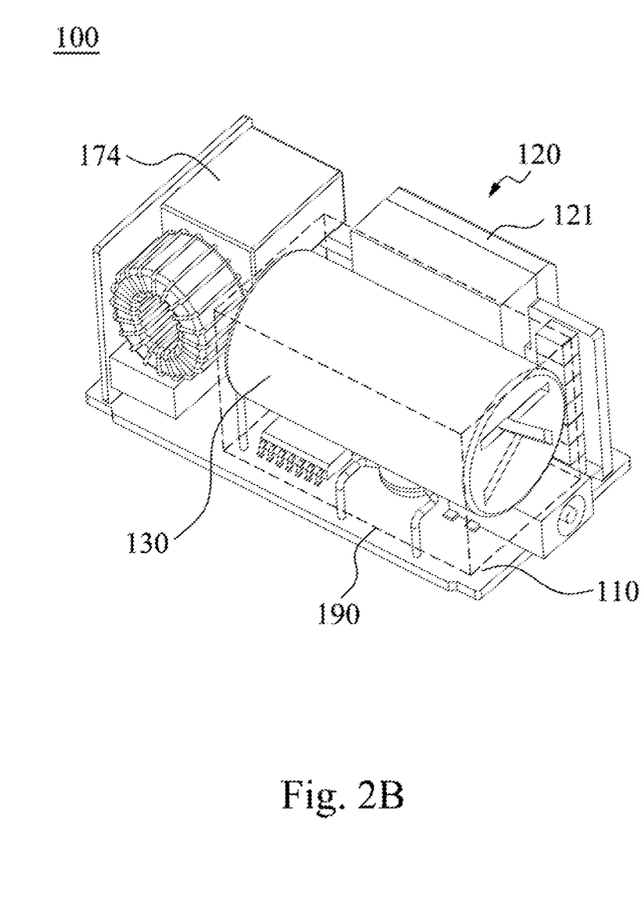
FIG. 2B depicts a schematic diagram of a power adaptor according to embodiments of this disclosure.

FIG. 2A depicts an assembly schematic diagram of a power adaptor according to embodiments of this disclosure. FIG. 2B depicts a schematic diagram of a power adaptor according to embodiments of this disclosure. As compared with FIG. 1A, disposition of an electromagnetic interference filter unit 174 of the power adaptor 100 shown in FIG. 2A is somewhat different from that of the electromagnetic interference filter unit 172 shown in FIG. 1A. In greater detail, the main electric units 110 of the power adaptors 100 shown in FIG. 1A and FIG. 2A both have a lengthwise direction L and a widthwise direction W. The lengthwise direction L is perpendicular to the widthwise direction W. The electromagnetic interference filter unit 172 in FIG. 1A is located on one side of the main electric unit 110 along the widthwise direction W, and only occupies part of a width of the one side. The transformer unit 120 is located on one side of the main electric unit 110 along the lengthwise direction L, and occupies an overall length of the one side.

As compared with FIG. 1A, the electromagnetic interference filter unit 174 in FIG. 2A is located on one side of the main electric unit 110 along the widthwise direction W, and occupies an overall width of the one side. The transformer unit 120 is located on one side of the main electric unit 110 along the lengthwise direction L, and occupies part of a length of the one side. In FIG. 2A, the transformer unit 120 will occupy a smaller area. If seen from another perspective, a circuit board of the transformer unit 120 is shorter. Hence, the transformer unit 120 occupies a smaller area of the main electric unit 110. Overall speaking, the electromagnetic interference filter unit 174 in FIG. 2A is larger than the electromagnetic interference filter unit 172 in FIG. 1A. As a result, the electromagnetic interference filter unit 174 has a better electromagnetic interference filtering effect. Additionally, the side of the PCB of the transformer unit 120 which close to the electromagnetic interference filter unit 174 in FIG. 2A is lower, which can be disposed underneath the electromagnetic interference filter unit 174. This structural feature can be more readily understood with reference to FIG. 2B. In FIG. 2B, the electromagnetic interference filter unit 174 covers the side of the PCB of the transformer unit 120 which close to the electromagnetic interference filter unit 174. That is, a left-side board of the transformer unit 120 is disposed underneath the electromagnetic interference filter unit 174. With the above structural configuration, space of the power adaptor 100 can further be fully utilized to facilitate miniaturization of the product. In addition, FIG. 2A is the assembly schematic diagram of the power adaptor 100, the power adaptor 100 thus assembled is provided with reference to FIG. 2B.

In one embodiment, barriers (not shown in the figures) are disposed respectively between the electromagnetic interference filter unit 172 in FIG. 1A and the transformer unit 120 and the electromagnetic interference filter unit 174 in FIG. 2A and the transformer unit 120. In one embodiment, each of the barriers is a metal barrier. The barriers can reduce interferences between the electromagnetic interference filter unit 172 and the transformer unit 120 and interferences between the electromagnetic interference filter unit 174 and the transformer unit 120.

Figure 3:
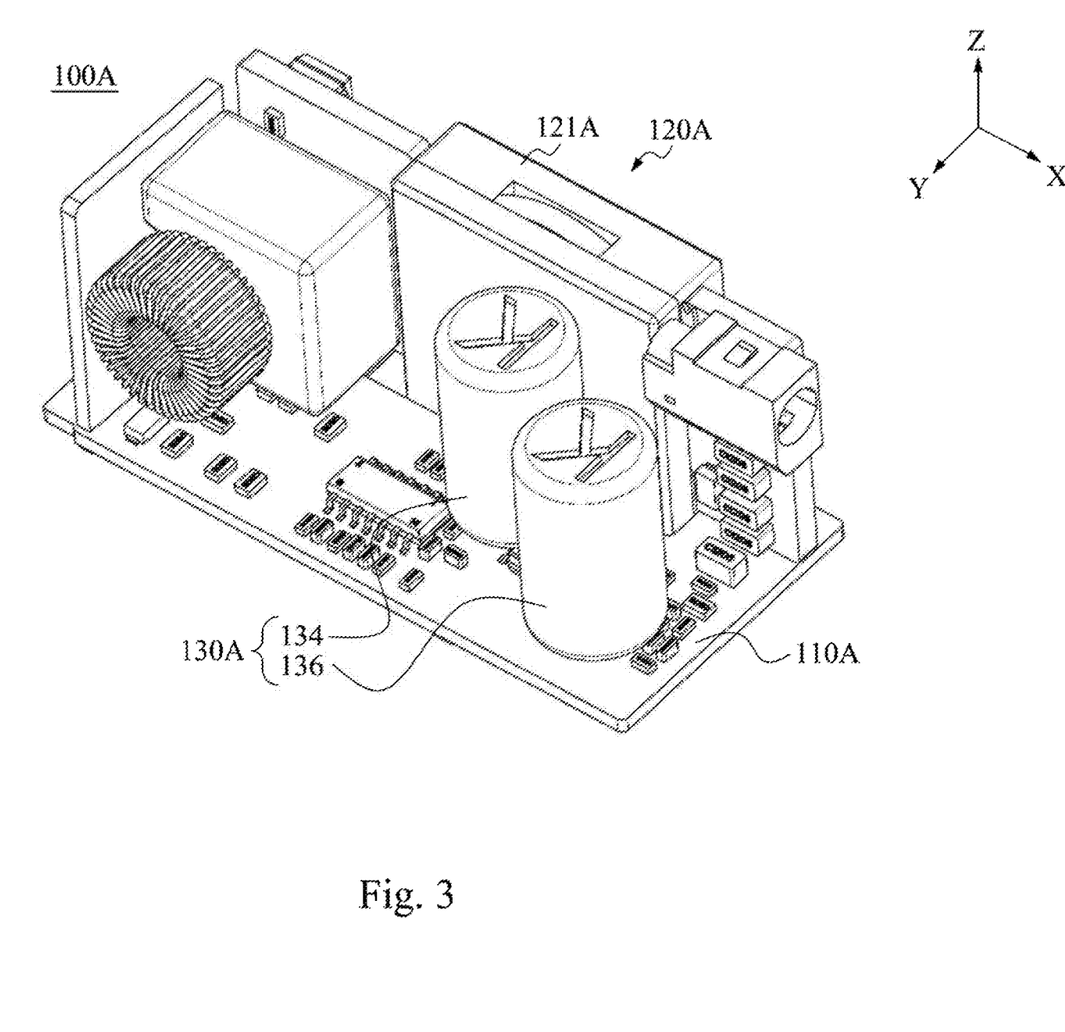
FIG. 3 depicts a schematic diagram of a power adaptor according to embodiments of this disclosure.

The bus capacitor units 130 in FIG. 1A and FIG. 2A are disposed on the main electric units 110. However, the present disclosure is not limited to FIG. 1A and FIG. 2A, and the bus capacitor unit 130 may be disposed on the transformer unit 120 depending on practical needs. In one embodiment, the bus capacitor unit 130 is immediately adjacent to the transformer unit 120. It is noted that the bus capacitor unit 130 may have one or more bus capacitors in it depending on practical needs. FIG. 3 depicts a schematic diagram of a power adaptor according to embodiments of this disclosure. As compared with the power adaptors 100 shown in FIG. 1A and FIG. 2A, a bus capacitor unit 130A of a power adaptor 100A in FIG. 3 comprises two bus capacitors 134, 136. However, the present disclosure is not limited to the embodiment shown in FIG. 3. A number of the bus capacitors in the bus capacitor unit 130A may be disposed depending on practical needs without departing from the spirit or scope of the present disclosure.

Figure 4:
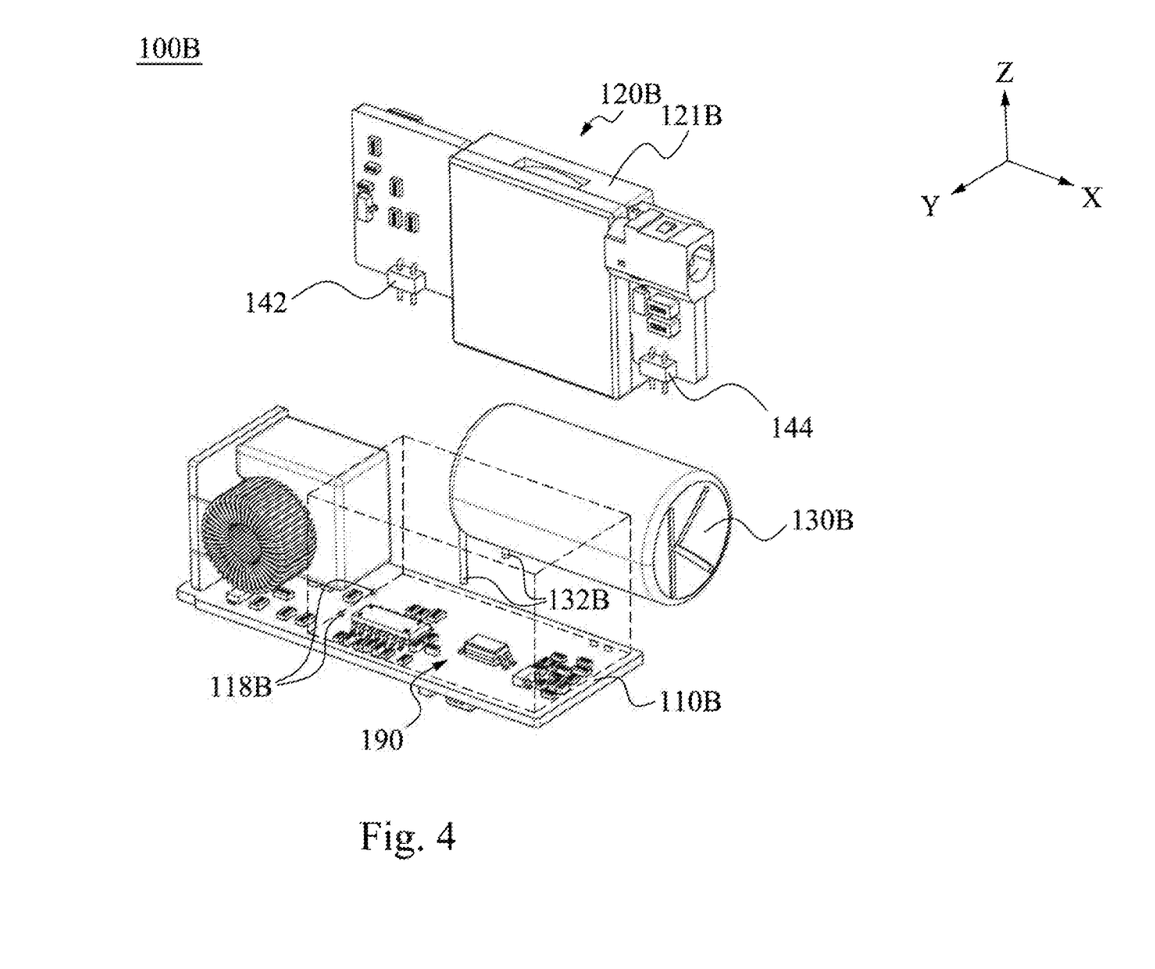
FIG. 4 depicts an assembly schematic diagram of a power adaptor according to embodiments of this disclosure.

A description is provided with reference to FIG. 1A and FIG. 2A. In one embodiment, the main electric units 110 may comprise recesses 116. At least, part of the transformer units 120 is disposed in the recesses 116. This configuration method can allow a larger transformer core to be disposed inside the transformer unit. In another embodiment, as compared with the main electric units 110 in FIG. 1A and FIG. 2A that have the recesses 116, a main electric unit 110B in FIG. 4 is a solid board, which makes an effective area of the main electric unit 110B on which elements can be disposed larger. However, the present disclosure is not limited to the embodiment shown in FIG. 4. Shapes and positions of a connecting portion, the fixing hole, and the fixing pillar may be designed depending on practical needs without departing from the spirit or scope of the present disclosure.

Additionally, as compared with the power adaptors 100 shown in FIG. 1A and FIG. 2A, an internal connection method of the power adaptor 100B in FIG. 4 is different. For example, the power adaptor 100B in FIG. 4 further comprises at least one connecting portion, such as connecting portions 142, 144 configured to connect the main electric unit 110B and a transformer unit 120B. In one embodiment, one end of each of the connecting portions 142, 144 is connected to the transformer unit 120B and another end of the each of the connecting portions 142, 144 is connected to the main electric unit 110B so that the main electric unit 110B is joined to the transformer unit 120B.

Figure 5A:
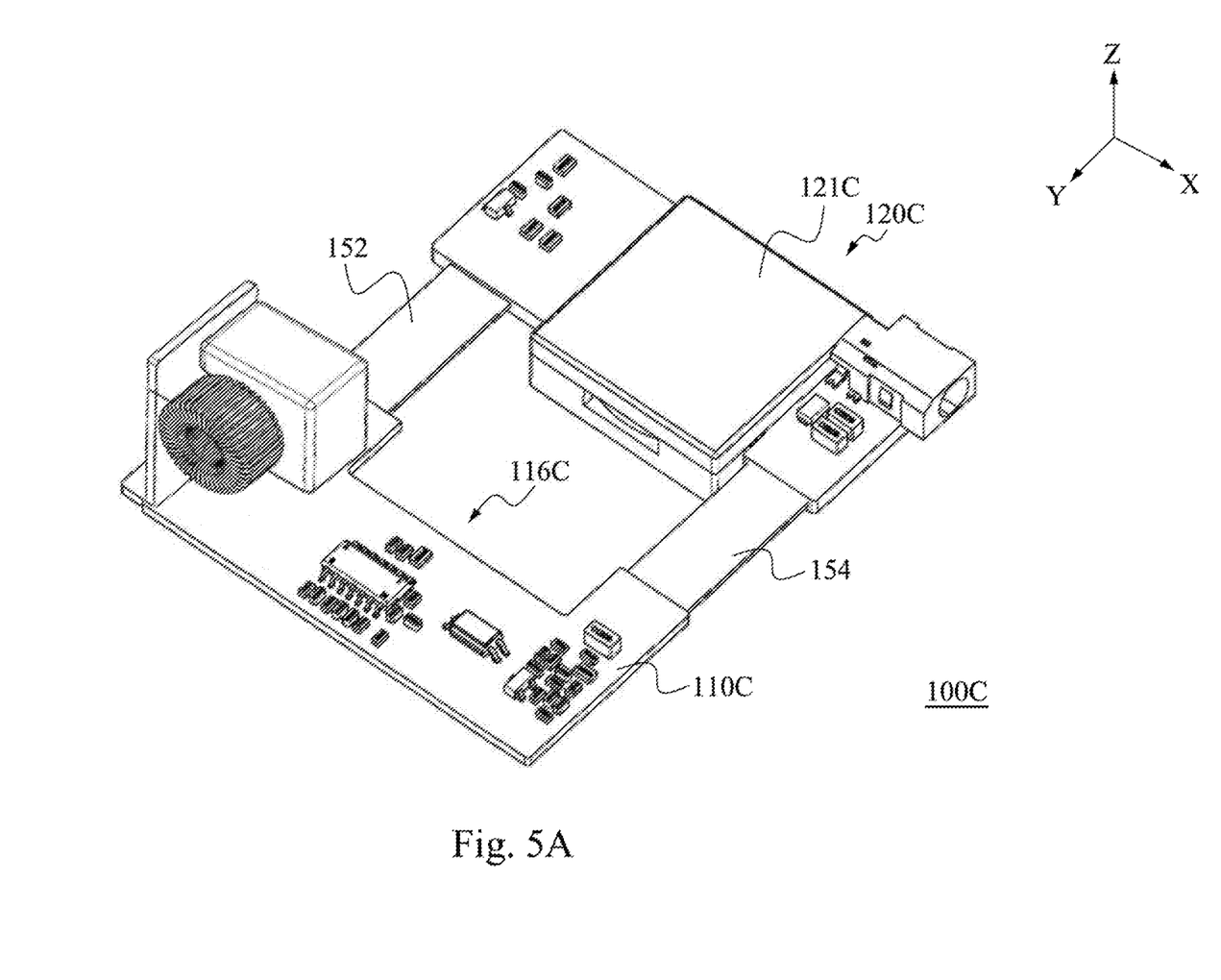
FIG. 5A depicts an assembly schematic diagram of a power adaptor according to embodiments of this disclosure.

FIG. 5A depicts an assembly schematic diagram of a power adaptor according to embodiments of this disclosure. As compared with the power adaptors 100 shown in FIG. 1A and FIG. 2A, an internal connection method of a power adaptor 100C in FIG. 5A is different. For example, the power adaptor 100C in FIG. 5A further comprises at least one flexible printed circuit board, such as flexible printed circuit boards 152, 154 configured to connect a main electric unit 110C and a transformer unit 120C. It is noted that FIG. 5A depicts a connection state in which the main electric unit 110C and the transformer unit 120C are laid flat on a same surface to facilitate the understanding of the connection method of the main electric unit 110C and the transformer unit 120C. However, the state that the main electric unit 110C has been assembled with the transformer unit 120C through the flexible printed circuit boards 152, 154 is provided with reference to FIG. 5B.

Figure 5B:
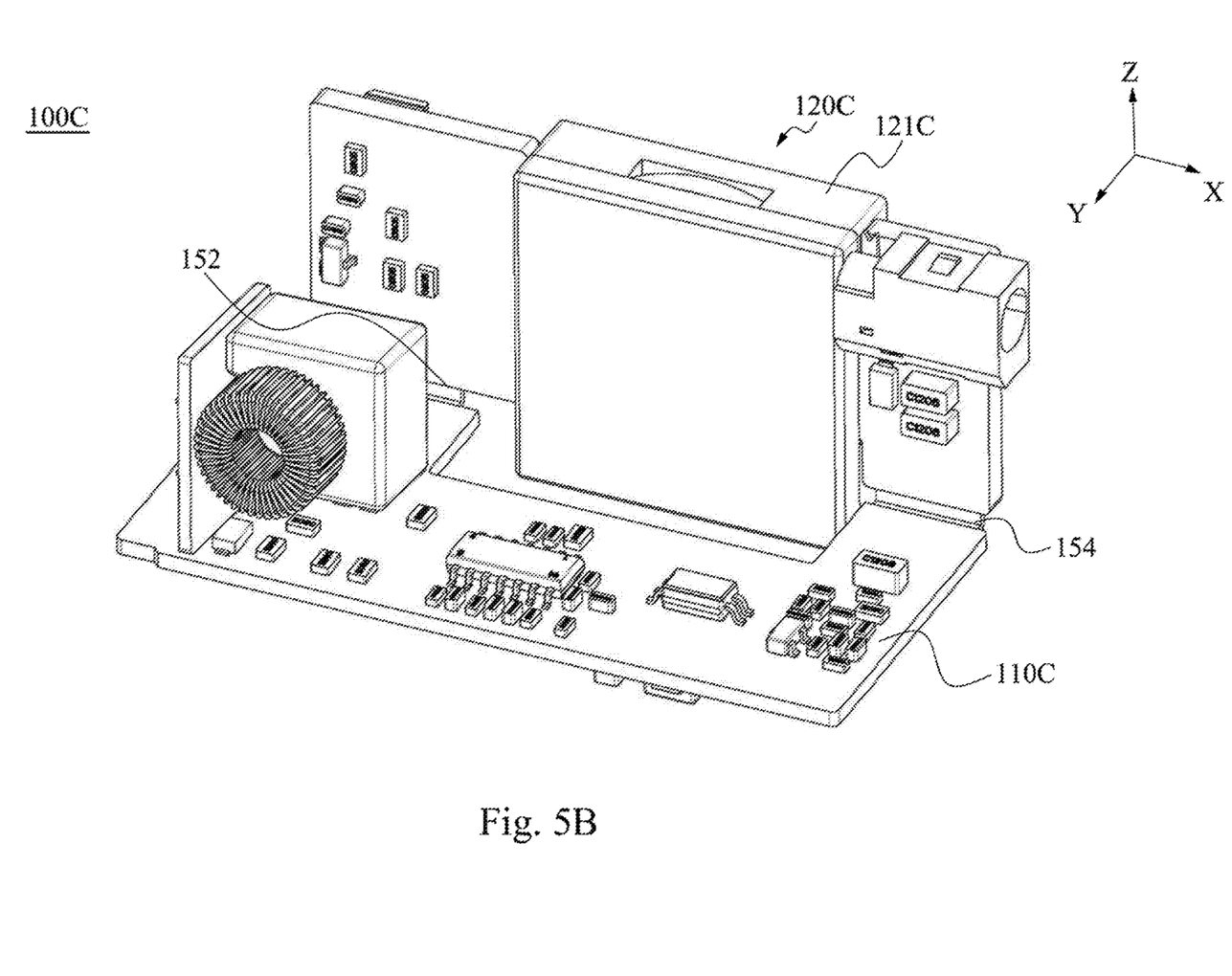
FIG. 5B depicts a partial structural schematic diagram of a power adaptor according to embodiments of this disclosure.

FIG. 5B depicts a partial structural schematic diagram of a power adaptor according to embodiments of this disclosure. As shown in FIG. 5B, the transformer unit 120C can be bent upward from the surface shown in FIG. 5A by 90 degrees so as to be disposed as the state shown in FIG. 5B. That is, the transformer unit 120C is perpendicular to the main electric unit 110C. In addition, a bus capacitor unit (not shown in the figure) may be disposed in a containing space formed between the main electric unit 110C and the transformer unit 120. It is noted that the present disclosure is not limited to the embodiment shown in FIG. 5A and FIG. 5B, which is only intended to depict an example of one of the implementation methods of the present disclosure.

Figure 6A:
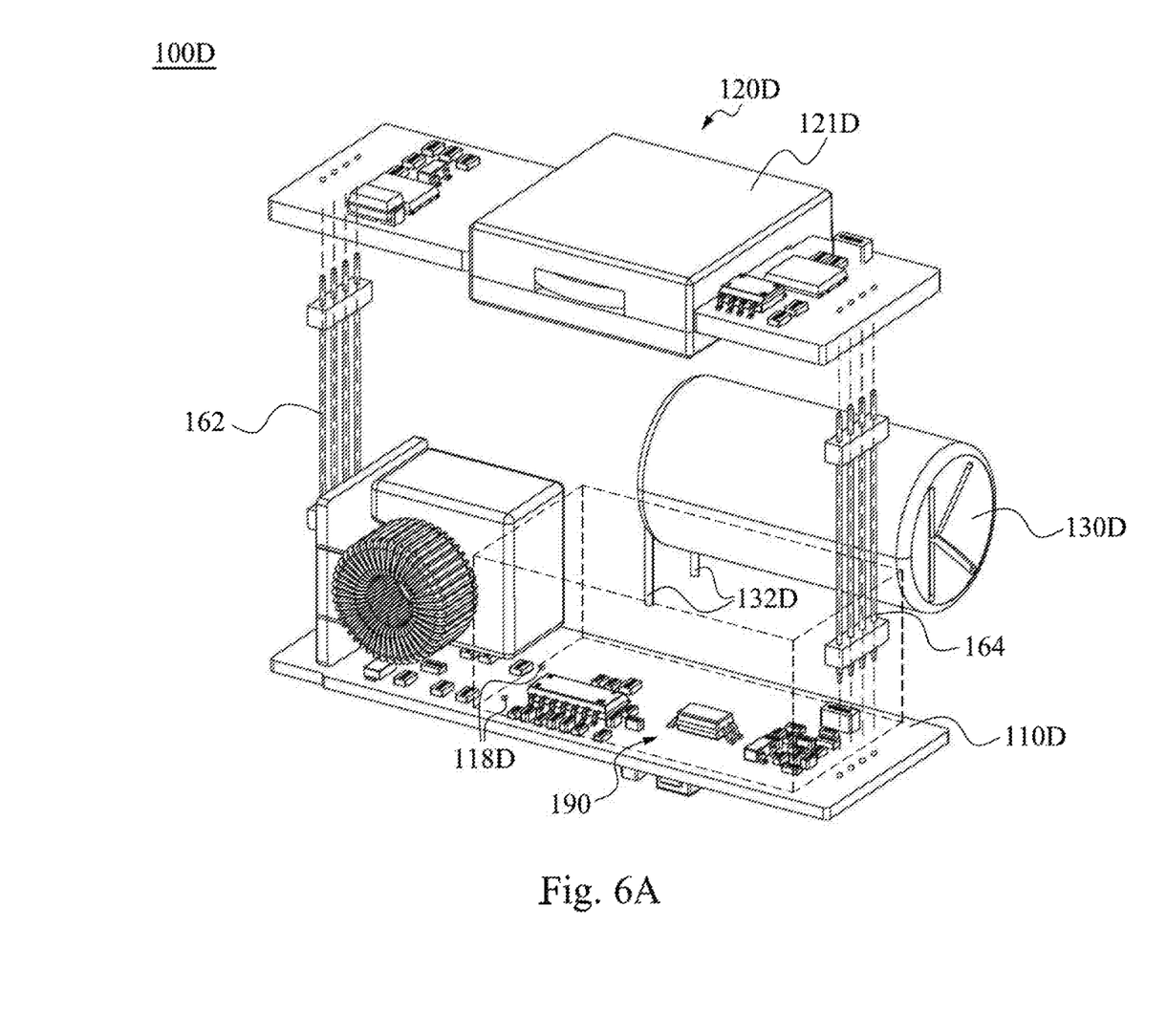
FIG. 6A depicts an assembly schematic diagram of a power adaptor according to embodiments of this disclosure.

FIG. 6A depicts an assembly schematic diagram of a power adaptor according to embodiments of this disclosure. As compared with the power adaptors 100 shown in FIG. 1A and FIG. 2A, an internal connection method of a power adaptor 100D in FIG. 6A is different. For example, a bus capacitor unit 130D is disposed on a main electric unit 110D. A transformer unit 120 is configured above the bus capacitor unit 130D. In one embodiment, the power adaptor 100D further comprises at least one connecting portion, such as connecting portions 162, 164 configured to connect the main electric unit 110D and the transformer unit 120D. In another embodiment, one end of each of the connecting portions 162, 164 is connected to the transformer unit 120D and another end of the each of the connecting portions 162, 164 is connected to the main electric unit 110D so that the main electric unit 110D is joined to the transformer unit 120D. In one embodiment, the connecting portions 162, 164 has a specific length to allow the containing space 190 to be formed between the main electric unit 110D and the transformer unit 120D, and the bus capacitor unit 130D is disposed in the containing space 190. In still another embodiment, the main electric unit 110D comprises at least one fixing hole 118D, and the bus capacitor unit 130D comprises at least one fixing pillar 132D. The fixing pillar 132D is configured to be joined to the fixing hole 118D correspondingly so that the bus capacitor unit 130D is fixed on the main electric unit 110D. However, the present disclosure is not limited to the embodiment shown in FIG. 6A. Shapes and positions of the connecting portions, the fixing hole, and the fixing pillar may be designed depending on practical needs without departing from the spirit or scope of the present disclosure.

Figure 6B:
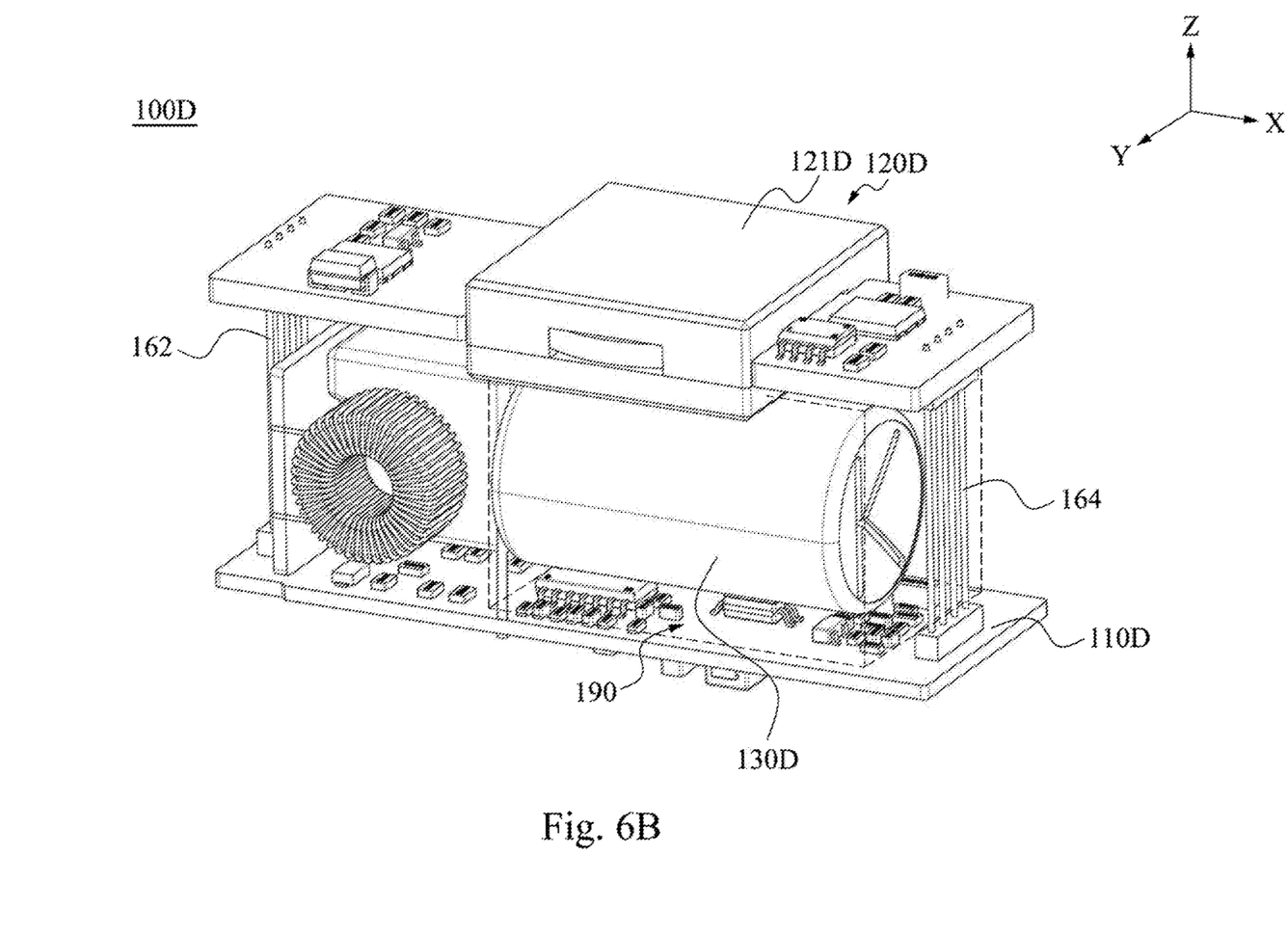
FIG. 6B depicts a schematic diagram of a power adaptor according to embodiments of this disclosure.

In the present embodiment, the main electric unit 110D is disposed on a first surface, the transformer unit 120D is disposed on a second surface. The first surface and the second surface are both disposed on the X-Y plane. Hence, the first surface is parallel with the second surface. In other words, the main electric unit 110D and the transformer unit 120D are configured to present 180 degrees therebetween. FIG. 6A depicts an assembly schematic diagram of the power adaptor 100D, the power adaptor 100D thus assembled is provided with reference to FIG. 6B. As shown in FIG. 6B, the transformer unit 120D according to the present disclosure is configured on an outermost side of the whole power adaptor 100D, which is advantageous for the transformer unit 120D to directly dissipate heat to the outside. In addition to that, owing to the characteristic that the bus capacitor unit 130D itself does not easy generating heat, the bus capacitor unit 130D is disposed at a position immediately adjacent to the transformer unit 120D according to the present disclosure, such that the bus capacitor unit 130D is utilized to further dissipate heat of the transformer unit 120. As a result, the present disclosure can actually improve the problem that a miniaturization design of the power adaptor 100D is disadvantageous for heat dissipation.

In another embodiment, the bus capacitor unit 130D of the power adaptor 100D shown in FIG. 6B may comprise two or more than two bus capacitors (not shown in the figure) depending on practical needs. The present disclosure is not limited to the embodiment shown in FIG. 6A and FIG. 6B, which is only intended to depict an example of one of the implementation methods of the present disclosure.

Figure 7A:
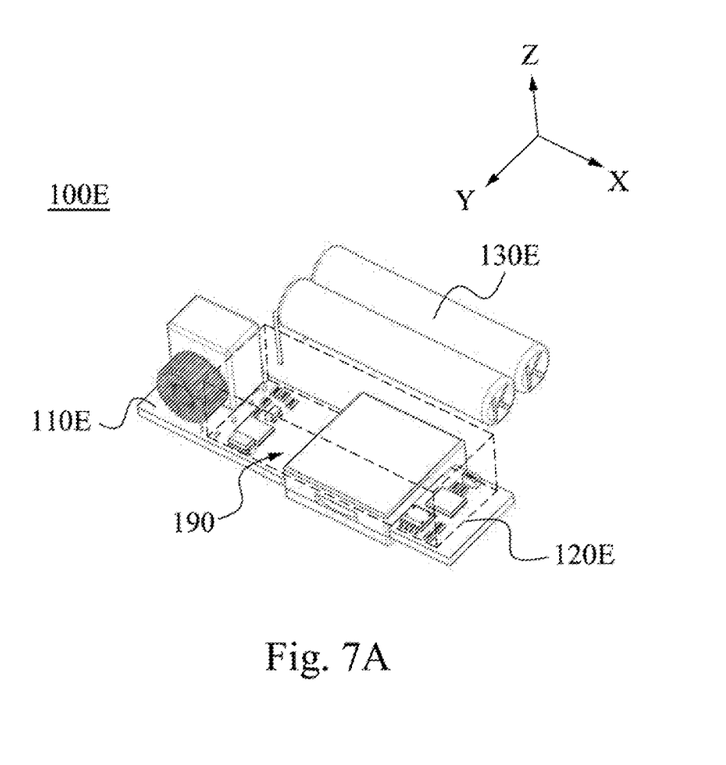
FIG. 7A depicts an assembly schematic diagram of a power adaptor according to embodiments of this disclosure.

FIG. 7A depicts an assembly schematic diagram of a power adaptor according to embodiments of this disclosure. As compared with the power adaptor 100 shown in FIG. 1A, an internal layout of a power adaptor 100E shown in FIG. 7A is different. For example, a main electric unit 110E and a transformer unit 120E are disposed on a same surface. In addition, in one embodiment, the main electric unit 110E is coupled to the transformer unit 120E so that the main electric unit 110E and the transformer unit 120E are integrated and the containing space 190 is formed above the main electric unit 110E and the transformer unit 120E. In addition to that, a bus capacitor unit 130E is disposed above the main electric unit 110E and the transformer unit 120E and positioned in the containing space 190. In another embodiment, the bus capacitor unit 130E comprises at least one bus capacitor. In still another embodiment, the bus capacitor unit 130E comprises at least two bus capacitors parallel and connected to each other.

Figure 7B:
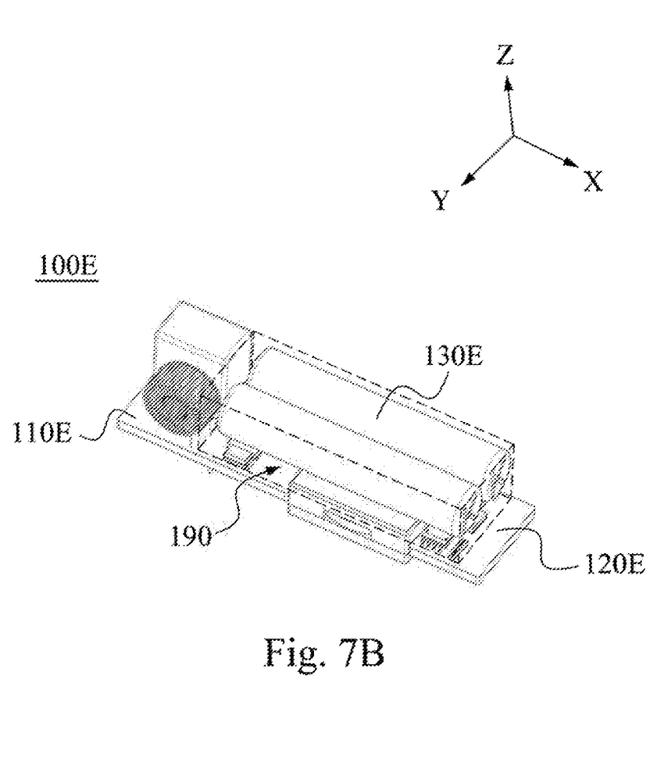
FIG. 7B depicts a schematic diagram of a power adaptor according to embodiments of this disclosure.

FIG. 7A depicts an assembly schematic diagram of the power adaptor 100E, the power adaptor 100E thus assembled is provided with reference to FIG. 7B. As shown in a configuration of the power adaptor 100E in FIG. 7B, the transformer unit 120E according to the present disclosure is configured on an outermost side of the whole power adaptor 100E, which is advantageous for the transformer unit 120E to directly dissipate heat to the outside. In addition to that, owing to the characteristic that the bus capacitor unit 130E itself does not easy generating heat, the bus capacitor unit 130E is disposed at a position immediately adjacent to the transformer unit 120E according to the present disclosure, such that the bus capacitor unit 130E is utilized to further dissipate heat of the transformer unit 120E. As a result, the present disclosure can actually improve the problem that a miniaturization design of the power adaptor 100E is disadvantageous for heat dissipation. In another embodiment, the bus capacitor unit 130E of the power adaptor 100E shown in FIG. 7B may comprise two or more than two bus capacitors (not shown in the figure) depending on practical needs. The present disclosure is not limited to the embodiment shown in FIG. 7A and FIG. 7B, which is only intended to depict an example of one of the implementation methods of the present disclosure.

It is therefore understood from the embodiments of the present disclosure that the present disclosure has the following advantages. The present disclosure provides a power adaptor to improve the problem that the miniaturization design of the power adaptor is disadvantageous for heat dissipation, and also improve the problem that space is wasted when assembling the discrete plug-in elements of the traditional power adaptor to avoid limiting the miniaturization of the power adaptor. In addition, the problem that much manual work is required when using the discrete plug-in elements to assemble the power adaptor, which is disadvantageous for automated production, is also improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A power adaptor comprising:
   a main electric unit disposed on a first surface;
   a transformer unit configured on the main electric unit and disposed on a second surface, wherein the first surface is perpendicular to the second surface, and the main electric unit and the transformer unit form a containing space, wherein the transformer unit comprises a printed circuit board;
   a bus capacitor unit comprising at least one bus capacitor and disposed in the containing space; and
   an electromagnetic interference filter unit disposed on the main electric unit;
   wherein the main electric unit has a lengthwise direction and a widthwise direction, and the lengthwise direction is perpendicular to the widthwise direction, wherein the electromagnetic interference filter unit is located on one side of the main electric unit along the widthwise direction, and the transformer unit is located on one side of the main electric unit along the lengthwise direction.

2. The power adaptor of claim 1, wherein the bus capacitor unit is fixed on and connected to the main electric unit or the transformer unit.

3. The power adaptor of claim 1, wherein the bus capacitor unit is immediately adjacent to the transformer unit.

4. The power adaptor of claim 1, wherein the electromagnetic interference filter unit only occupies part of a width of the one side along the widthwise direction, the transformer unit occupies an overall length of the one side along the lengthwise direction.

5. The power adaptor of claim 1, wherein the electromagnetic interference filter unit occupies an overall width of the one side along the widthwise direction, the transformer unit only occupies part of a length of the one side along the lengthwise direction.

6. The power adaptor of claim 5, wherein the electromagnetic interference filter unit covers part of a PCB of the transformer unit.

7. The power adaptor of claim 1, wherein a barrier is disposed between the electromagnetic interference filter unit and the transformer unit.

8. The power adaptor of claim 1, wherein the main electric unit comprises a recess, wherein at least part of the transformer unit is disposed in the recess.

9. The power adaptor of claim 1, wherein the main electric unit comprises at least one fixing slot, the transformer unit comprises at least one fixing portion, wherein the fixing portion is configured to be joined to the fixing slot.

10. The power adaptor of claim 1, further comprising:
    at least one connecting portion configured to connect the main electric unit and the transformer unit.

11. The power adaptor of claim 1, further comprising:
    at least one flexible printed circuit board configured to connect the main electric unit and the transformer unit.

12. The power adaptor of claim 1, wherein a transformer in the transformer unit is a flat transformer, and the transformer unit comprises elements of a secondary-side circuit of the power adapter.

13. A power adaptor comprising:
    a main electric unit;
    a transformer unit configured on an outer side of the power adaptor, wherein the main electric unit and the transformer unit form a containing space, wherein the transformer unit comprises a printed circuit board;
    a bus capacitor unit comprising at least one bus capacitor and disposed in the containing space, and
    an electromagnetic interference filter unit disposed on the main electric unit;
    wherein the main electric unit has a lengthwise direction and a widthwise direction, and the lengthwise direction is perpendicular to the widthwise direction, wherein the electromagnetic interference filter unit is located on one side of the main electric unit along the widthwise direction, and the transformer unit is located on one side of the main electric unit along the lengthwise direction.

14. The power adaptor of claim 13, wherein the bus capacitor unit is fixed on and connected to the main electric unit or the transformer unit, the bus capacitor unit is immediately adjacent to the transformer unit.

15. The power adaptor of claim 13, wherein the main electric unit is disposed on a first surface, the transformer unit is disposed on a second surface, wherein the first surface is perpendicular to the second surface.

16. The power adaptor of claim 15, wherein the main electric unit comprises a recess, wherein at least part of the transformer unit is disposed in the recess.

17. The power adaptor of claim 15, further comprising:
    at least one connecting portion configured to connect the main electric unit and the transformer unit.

18. The power adaptor of claim 13, wherein the transformer unit is configured above the bus capacitor unit.

19. The power adaptor of claim 18, wherein the main electric unit is disposed on a first surface, the transformer unit is disposed on a second surface, wherein the first surface is parallel with the second surface.

20. The power adaptor of claim 13, wherein the main electric unit and the transformer unit are disposed on a same surface.

21. The power adaptor of claim 20, wherein the main electric unit is coupled to the transformer unit.

22. The power adaptor of claim 20, wherein the bus capacitor unit is disposed above the main electric unit and the transformer unit.

23. The power adaptor of claim 13, wherein a transformer in the transformer unit is a flat transformer, and the transformer unit comprises elements of a secondary-side circuit of the power adapter.

* * * * *